United States Patent [19]
Okada et al.

[11] Patent Number: 5,491,446
[45] Date of Patent: Feb. 13, 1996

[54] ADAPATIVE CONTROL DEVICE

[75] Inventors: Tsuyoshi Okada, Yokosuka; Toshiaki Kobayashi, Shiki; Hidetaka Ozawa, Urawa, all of Japan

[73] Assignees: Matsushita Electric Industrial Co., Ltd., Osaka; Honda Motor Co., Ltd., Tokyo, both of Japan

[21] Appl. No.: 152,013

[22] Filed: Nov. 15, 1993

[30] Foreign Application Priority Data

Nov. 19, 1992 [JP] Japan .................................. 4-310443

[51] Int. Cl.$^6$ .................................................. H04B 15/00
[52] U.S. Cl. ........................... 327/551; 327/553; 327/362
[58] Field of Search ................................. 327/551, 552, 327/553, 98, 307, 310, 311, 309, 312, 317, 316, 538, 362; 333/166, 167

[56] References Cited

U.S. PATENT DOCUMENTS 4,052,559  10/1972  Paul et al. ................................ 333/166
4,730,281  3/1988  Rodney et al. ........................... 362/44

*Primary Examiner*—Timothy P. Callahan
*Assistant Examiner*—Dinh T. Le
*Attorney, Agent, or Firm*—Stevens, Davis, Miller & Mosher

[57] ABSTRACT

An adaptive control device is arranged to cancel periodic noises without any malfunction and delay if aperiodic noises are mingled in the periodic noises. In the adaptive control device, the reference signal sensor senses a reference signal. The reference signal is filtered in the adaptive filter. The filtered signal is applied to the actuator serving as an electrical-mechanical converting unit so that the signal may be added to the input noises. The added result corresponding to an error is converted into an electric signal through the effect of the sensor. The electric signal is applied to the periodic signal separator for separating the signal into a periodic error and an aperiodic error. The coefficient updating unit operates to update a tap coefficient of the adaptive filter by employing an algorithm such as an LMS by using the separated periodic error and the signal filtered by the transfer characteristic compensating filter.

8 Claims, 6 Drawing Sheets

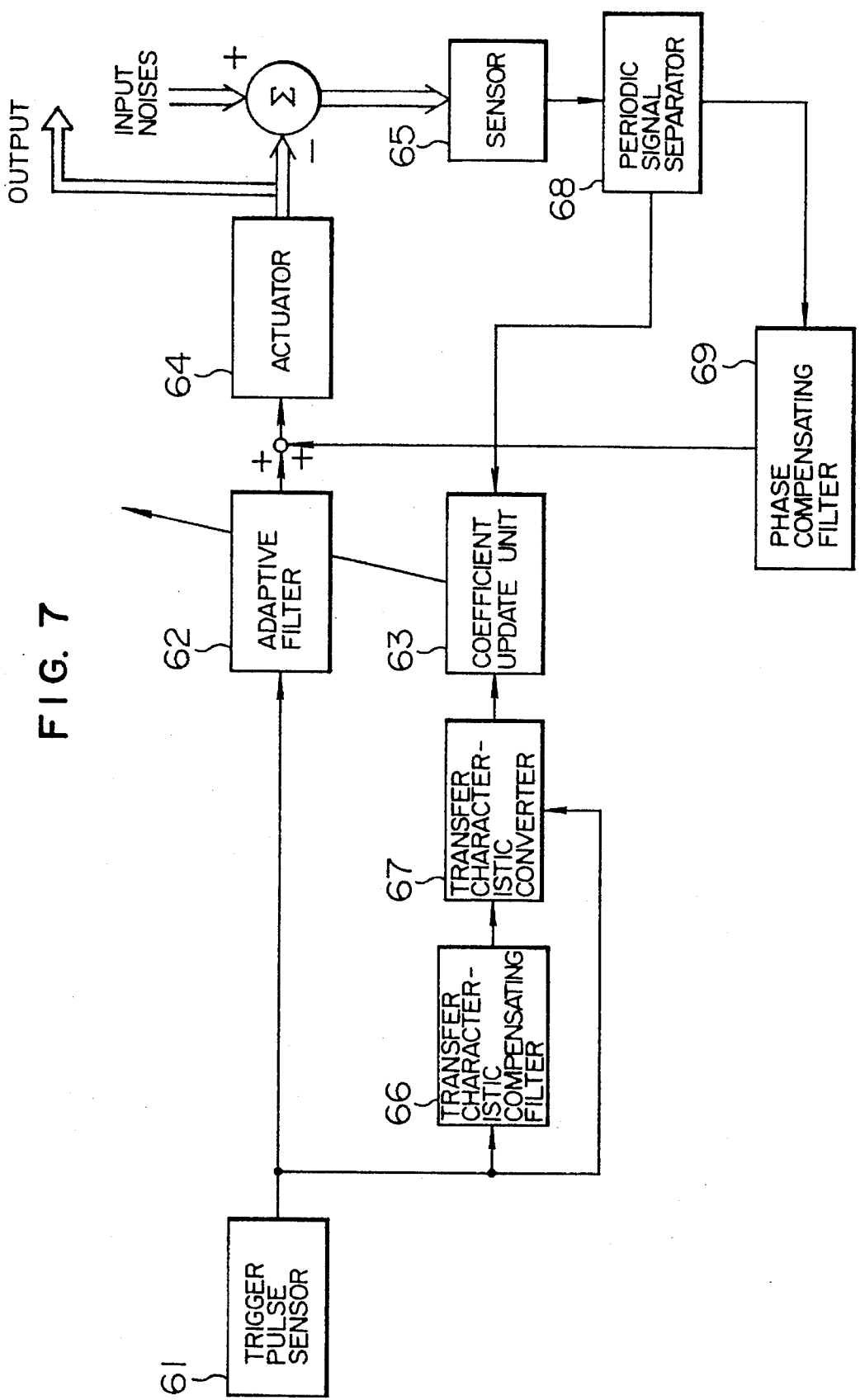

ADAPATIVE CONTROL DEVICE

BACKGROUND OF THE INVENTION

1. Field of the Invention

The present invention relates to an adaptive control device which is arranged to remove periodic noises, that is, noises synchronized with an engine such as vibrations or ambient noises brought about inside of a car with an adaptive filter.

2. Description of the Related Art

Recently, emphasis has been placed on an adaptive control device which offers a very flexible control function of machines or the like according to an environment around such machines. In particular, an adaptive filter for cancelling periodic noises is spotlighted, because the noise periodicity may make its arrangement simpler.

Now, the description will be oriented to such a conventional adaptive control device as mentioned above with reference to the drawings. FIG. 1 shows a schematic arrangement of the conventional adaptive control device. In FIG. 1, a numeral 71 denotes a trigger pulse sensor. A numeral 72 denotes an adaptive filter. A numeral 73 denotes a coefficient update unit. A numeral 74 denotes an actuator. A numeral 75 denotes a sensor. A numeral 76 denotes a transfer characteristic compensating filter. A numeral 77 denotes a transfer characteristic converter.

The operation of the adaptive control device arranged as described above will now be discussed below. In FIG. 1, a pulse synchronized with vibration noises from the outside like engine vibrations is sensed by the trigger pulse sensor 71 and is applied to the adaptive filter 72. Such a pulse is allowed to be easily realized. If, for example, a pulse for a rotary machine like an engine is produced, the use of a rotary sensor for generating a pulse at each minute angle of a rotation realizes easy production of such a pulse. In the case of a car, an engine control unit monitors a rotary pulse signal of a cam or a crank and thus may be used for producing the pulse. The adaptive filter 72 outputs a control signal to the actuator 74 so that the actuator 74 may generate vibrations. The vibrations are added to the noise vibrations at a desired control point. The added result, that is, an error is sensed as an electric signal by the sensor 75 and then is applied to the coefficient update unit 73.

The adaptive filter 72 uses the pulse sensed by the trigger pulse sensor 71 as a trigger and sequentially outputs a value of each tap provided therein. The adaptive filter 72 provides the same number of taps as a quotient obtained by dividing a number of pulses outputted per one rotation of an engine sensed by the trigger pulse sensor 71 by the least significant degree of vibrations to be intentionally controlled. For example, assuming that 50 pulses per one rotation of the engine are outputted and the least significant degree of the vibrations to be controlled is primary, 50/1=50 taps are provided in the adaptive filter 72. The adaptive filter 72, therefore, enables derivation of an output constantly synchronized with the vibrations to be controlled.

On the other hand, the coefficient update unit 73 operates to update a tap coefficient of the adaptive filter 72 based on an algorithm such as a synchronous LMS with an error sensed as an electric signal by the sensor 175 and a transfer characteristic compensating signal obtained by the transfer characteristic converter 77. The transfer characteristic converter 77 serves to convert the output of the compensating filer 76 into a frequency of a current trigger pulse signal. In general, an output delay of the actuator 74 and transfer characteristics from the actuator 74 to the sensor 75 are pre-stored in the compensating filter 76. The adaptive filter is updated based on an adaptive filtered X algorithm by referring to the pre-stored values. The update of the adaptive filter is thus done as considering the delays of these components. At this time, the compensating filter 76 needs the transfer characteristic converter 77 for converting the characteristic of the filter 76, because the characteristic of the filter 76 depends on a sampling frequency and this adaptive control device changes its output frequency on the number of engine rotations.

As set forth above, the conventional adaptive control device provides for cancellation of periodic noises synchronized with engine vibrations such as ambient vibrations inside of a car.

The foregoing conventional adaptive control device, however, has a problem in that all the periodic noises are not allowed to be cancelled if aperiodic noises are mingled in the periodic noises to be intentionally cancelled. To overcome this problem, the conventional adaptive control device has an inserted filter for compensating for the actuator. The actuator compensating filter disables to completely compensate for a delay of the actuator. In particular, if aperiodic noises are mingled, the compensating filter cannot achieve substantially complete compensation so that the output phase may be shifted. The shift of the output phase may cause the control device to malfunction. To avoid such malfunction of the control device, it is possible to reduce the amount of one update of the adaptive filter, that is, a gain of the control system. This reduction, however, makes a converging speed slower, which results in bringing about difficulty in corresponding to change of an environment, concretely, change of noise periodicity.

SUMMARY OF THE INVENTION

It is an object of the present invention to provide an improved adaptive control device which is capable of cancelling periodic noises even if aperiodic noises are mingled without any malfunction and delay.

In carrying out the above object, the adaptive control device according to the present invention includes periodic signal separating means for separating output errors corresponding to a differential signal between input noises and an output of the filter into aperiodic errors and periodic errors and an adaptive filer for setting a coefficient of the filter based on the periodic errors.

With this arrangement, the adaptive control device of the present invention enables to cancel only periodic errors in mingled periodic and aperiodic errors. The periodic errors thus can be cancelled for a short time without having to be adversely affected by the aperiodic errors.

BRIEF DESCRIPTION OF THE DRAWINGS

FIG. 7 is a block diagram showing a schematic arrangement of an adaptive control device according to a fourth embodiment of the present invention.

DESCRIPTION OF THE PREFERRED EMBODIMENTS

Hereafter, the description will be oriented to an adaptive control device according to an embodiment of the present invention.

Figure 1:
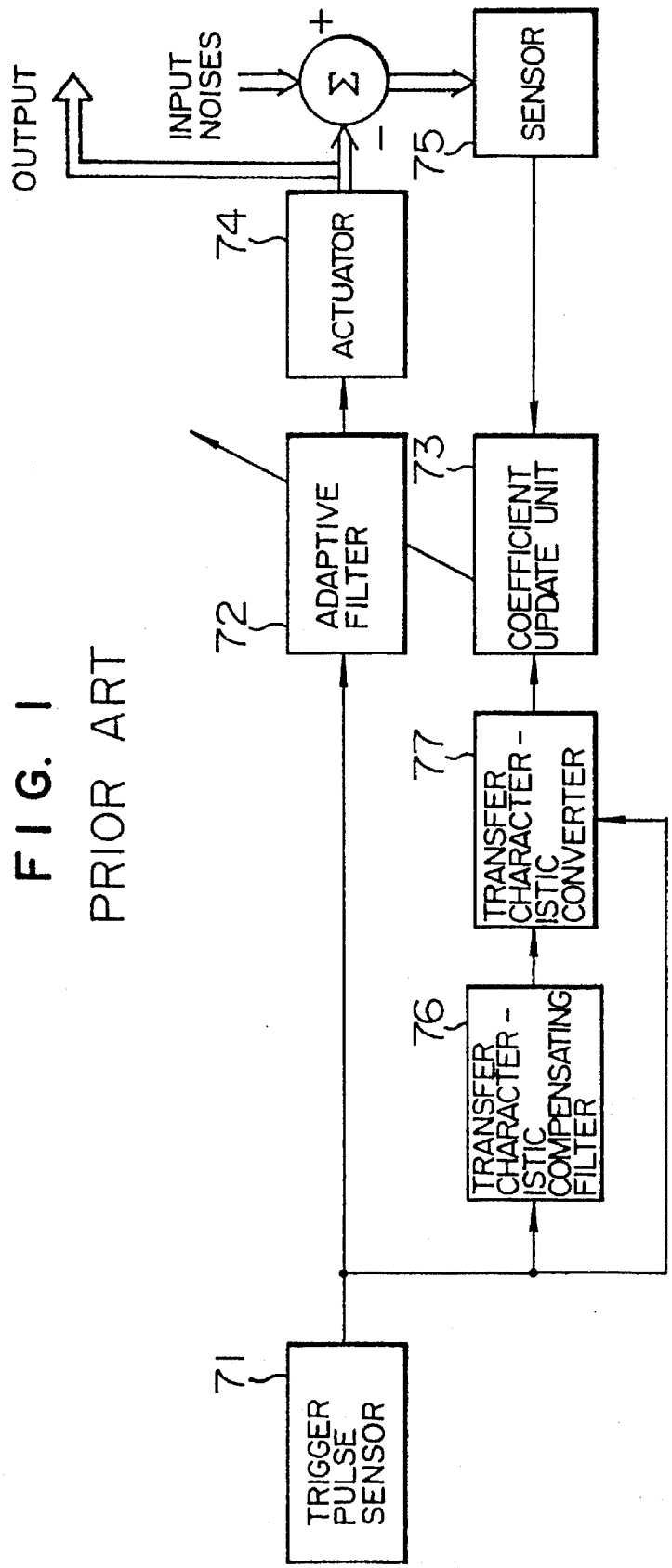
FIG. 1 is a block diagram showing a schematic arrangement of a conventional adaptive control device.
Figure 2:
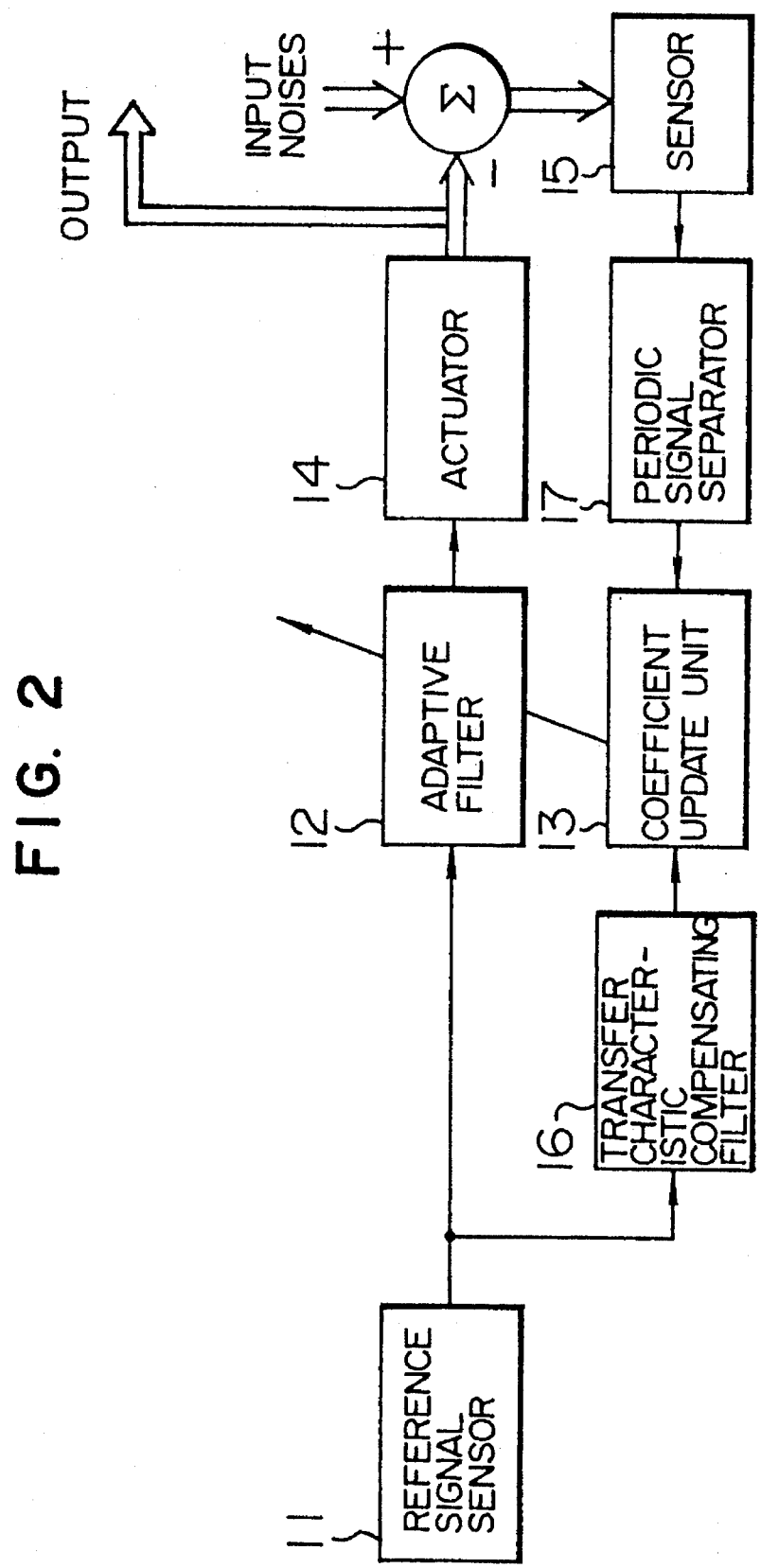
FIG. 2 is a block diagram showing a schematic arrangement of an adaptive control device according to a first embodiment of the present invention.

FIG. 2 shows a schematic arrangement of an adaptive control device according to a first embodiment of the present invention. In FIG. 2, a numeral 11 denotes a reference signal sensor. A numeral 12 denotes an adaptive filter. A numeral 13 denotes a coefficient update unit. A numeral 14 denotes an actuator serving as an electro-mechanical converting means. A numeral 15 denotes a sensor serving as an error signal sensing means. A numeral 16 denotes a transfer characteristic compensating filter for identifying transfer characteristics of the adaptive filter 12 to the sensor 15 in advance. A numeral 17 denotes a periodic signal separator.

Figure 3:
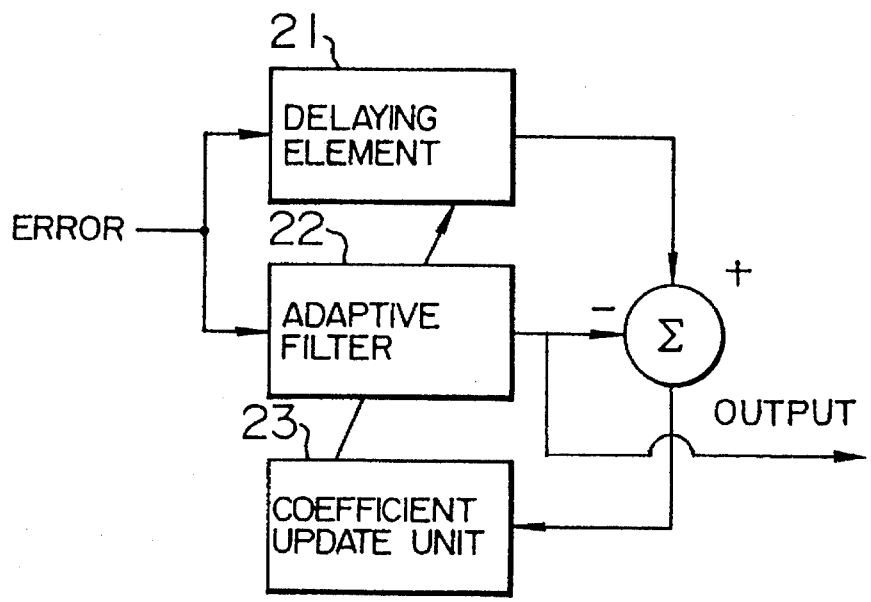
FIG. 3 is a block diagram showing a schematic arrangement of periodic signal separating means used in the first embodiment of the present invention.

FIG. 3 shows a schematic arrangement of the periodic signal separator 17 used in the first embodiment of the invention. In FIG. 3, a numeral 21 denotes a delaying element. A numeral 22 denotes an adaptive filter. A numeral 23 denotes a coefficient update unit.

Next, the operation of the first embodiment will be discussed. In FIG. 2, a reference signal sensed by the reference signal sensor is filtered through the adaptive filter 12. The adaptive filter 12 outputs a control signal to the actuator 14. The reference signal is detected from a part presumed as a vibration source of vibrations to be controlled, for example, an engine if the device applies to a car. On the other hand, the vibration noises from the outside, for example, the vibrations of the engine are added to the output of the actuator 14 as input noises. The added result, that is, an error, is sensed as an electric signal by the sensor 15. Then, the error is separated into the periodic error and the aperiodic error through the effect of the periodic signal separator 17. The separator 17 serves to send out only the periodic error to the coefficient update unit 13.

The coefficient update unit 13 serves to update a tap coefficient of the adaptive filter 12 based on an algorithm such as an LMS (Least Mean Square) by using the periodic error extracted by the separator 17 and a transfer characteristic compensating signal derived from the reference signal through the effect of the transfer characteristic compensating filter 16. In this embodiment, an output delay of the actuator 14 and the transfer characteristics from the actuator 14 to the sensor 15 are stored in the transfer characteristic compensating filter 16. The use of the filtered X algorithm for updating the adaptive filter 12 with reference to the stored values makes it possible to consider the delays of these components when the adaptive filter 12 is updated.

In a case that such an adaptive control device may apply to cancelling engine vibrations of a car, the main function of the adaptive control device is to control the periodic error. In this case, large vibrations except vibrations to be controlled by the error signal, for example, aperiodic vibrations caused when a car runs on a rugged road make an S/N ratio of a signal provided when controlling engine vibrations worse. This may lead to a large factor in lowering the controllability.

If the aperiodic signal is mingled in the periodic signal to be controlled, the use of the periodic signal separator 17 makes it possible to improve an S/N ratio and enhance the convergency and the controllability.

Next, the operation of the periodic signal separator 17 will be described with reference to FIG. 3. Noise vibrations are sensed by the sensor 15 and then is applied as input noises to the adaptive filter 22 and the delaying element 21. The coefficient update unit 23 operates to take a difference between the signal filtered by the adaptive filter 22 and a signal properly delayed by the delaying element 21 and a coefficient of the adaptive filter 22 on the LMS algorithm so that a square of the difference may be zero. With this operation, the adaptive filter 22 is updated so as to selectively output the past signal of its own correlated with the current signal of its own from the input noises. The signal like random noises having no autocorrelation is removed through the effect of the adaptive filter 22. Hence, only the periodic signals correlated with the past signals are allowed to be outputted.

As mentioned above, the adaptive control device according to the first embodiment provides the periodic signal separator 17 for separating an output error corresponding to a differential signal between input noises and the output of the adaptive filter 12 into the aperiodic error and the periodic error. Hence, the adaptive filter 12 is operated with the periodic error so that the malfunction on the aperiodic error contained in the output error may be prevented and the periodic error may be cancelled for a short time.

Figure 4:
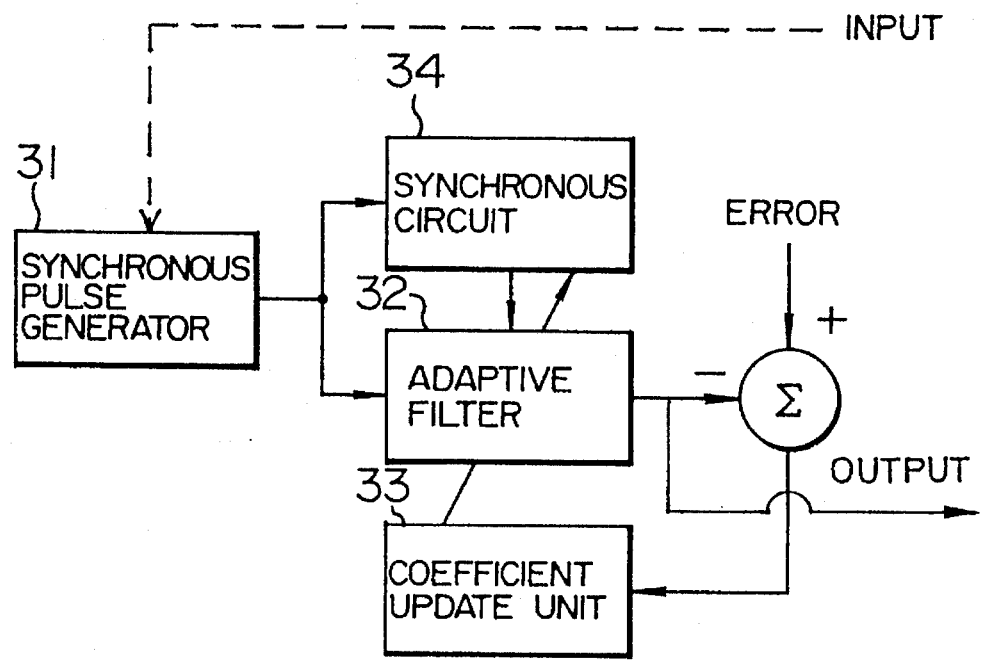
FIG. 4 is a block diagram showing a schematic arrangement of periodic signal separating means used in a second embodiment of the present invention.

FIG. 4 shows a schematic arrangement of a periodic signal separator used in the second embodiment of the present invention. The overall arrangement of the adaptive control device is the same as that of the first embodiment shown in FIG. 2. In FIG. 4, a numeral 31 denotes a synchronous pulse generator. A numeral 32 denotes an adaptive filter. A numeral 33 denotes a coefficient update unit. A numeral 34 denotes a synchronous circuit for re-locking an output of the adaptive filter 32 with the output of the synchronous pulse generator 31 as a trigger signal.

Next, the operation of the adaptive control device according to the second embodiment of the invention will be described. The adaptive control device according to the first embodiment shown in FIG. 2 operates to separate the periodic components synchronized with vibrations of driving wheels from the periodic components to be controlled. Hence, the adaptive control device may not be able to offer a sufficient effect. In order to treat a different periodic signal from the periodic signal to be controlled, the arrangement of the periodic signal separator 17 is required to change as shown in FIG. 4 so as to improve an S/N ratio and the convergency and the controllability.

In FIG. 4, the pulse signal primarily synchronized with a lower degree vibration having the longest vibration period of the vibrations to be controlled is applied to the adaptive filter 32. The synchronized pulse is generated by the synchronous pulse generator 31. The coefficient update unit 33 operates to take a difference between a signal filtered by the adaptive filter 32 and an input noise signal sensed by the sensor 15 and update a coefficient of the adaptive filter 32 on the synchronous LMS algorithm in a manner that a square of the difference may be zero. With this operation, the adaptive filter 32 is updated to output a noise signal correlated with a pulse signal, that is, a primary or more degree, selected from the input noises and separate and extract only the vibration components correlated with the pulse from the input noises.

Since the number of revolutions of an engine is constantly changed, it is not rare that the synchronous pulse generator 31 may output the next pulse while the adaptive filter 32 is outputting. The adaptive filter 32 has a sufficient tap length in light of the relation between the outputted lock frequency and the longest period of the vibration period. When the synchronous pulse generator 31 outputs the next pulse, the synchronous circuit 34 operates to make the currently outputted tap coefficient zero (0) and reset the output of the adaptive filter 32 so that the output may be restarted from the tap 0. This operation can keep constant synchronism between the pulse and the current number of revolutions of the engine.

Further, the adaptive control device according to the second embodiment may use the input of the adaptive filter 12 as the periodic pulse in the first embodiment shown in FIG. 2 and operates the overall second embodiment as the synchronous adaptive filter so as to improve an S/N ratio through the effect of the periodic signal separator 17.

As described above, the periodic signal separator 17 may operate when identifying the transfer characteristic compensating filter 16 if a group delay is contained in light of the arrangement and may have to identify the transfer characteristics containing the delaying elements in advance.

Figure 5:
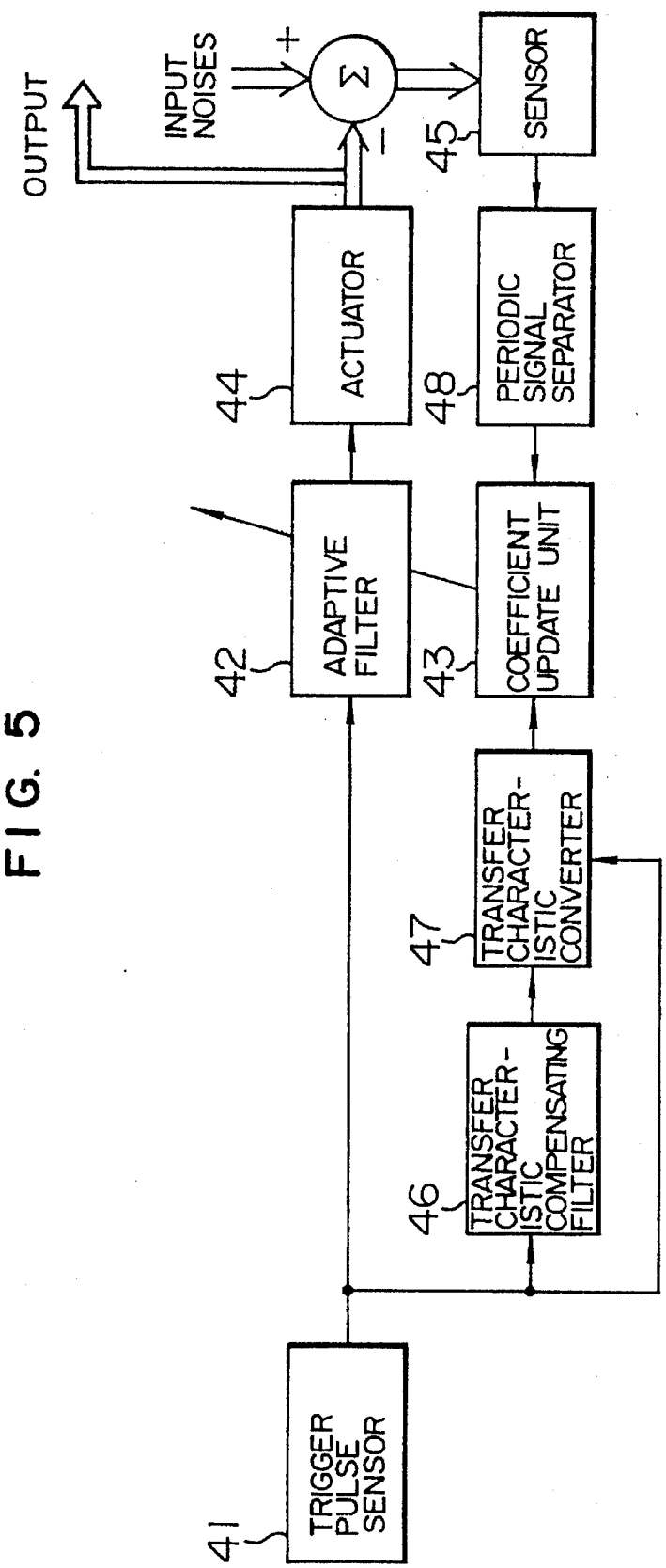
FIG. 5 is a block diagram showing a schematic arrangement of an adaptive control device according to a third embodiment of the present invention.

FIG. 5 shows a schematic arrangement of an adaptive control device according to a third embodiment of the present invention. In FIG. 5, a numeral 41 denotes a trigger pulse sensor. A numeral 42 denotes an adaptive filter. A numeral 43 denotes a coefficient update unit. A numeral 44 denotes an actuator serving as an electrical-mechanical converting means. A numeral 45 denotes a sensor serving as an error signal sensing means. A numeral 46 denotes a transfer characteristic compensating filter for identifying the transfer characteristics from the adaptive filter 42 to the sensor 45 in advance. A numeral 47 denotes a transfer characteristic converter for converting the transfer characteristic to a frequency of a trigger pulse signal. A numeral 48 denotes a periodic signal separator.

Figure 6:
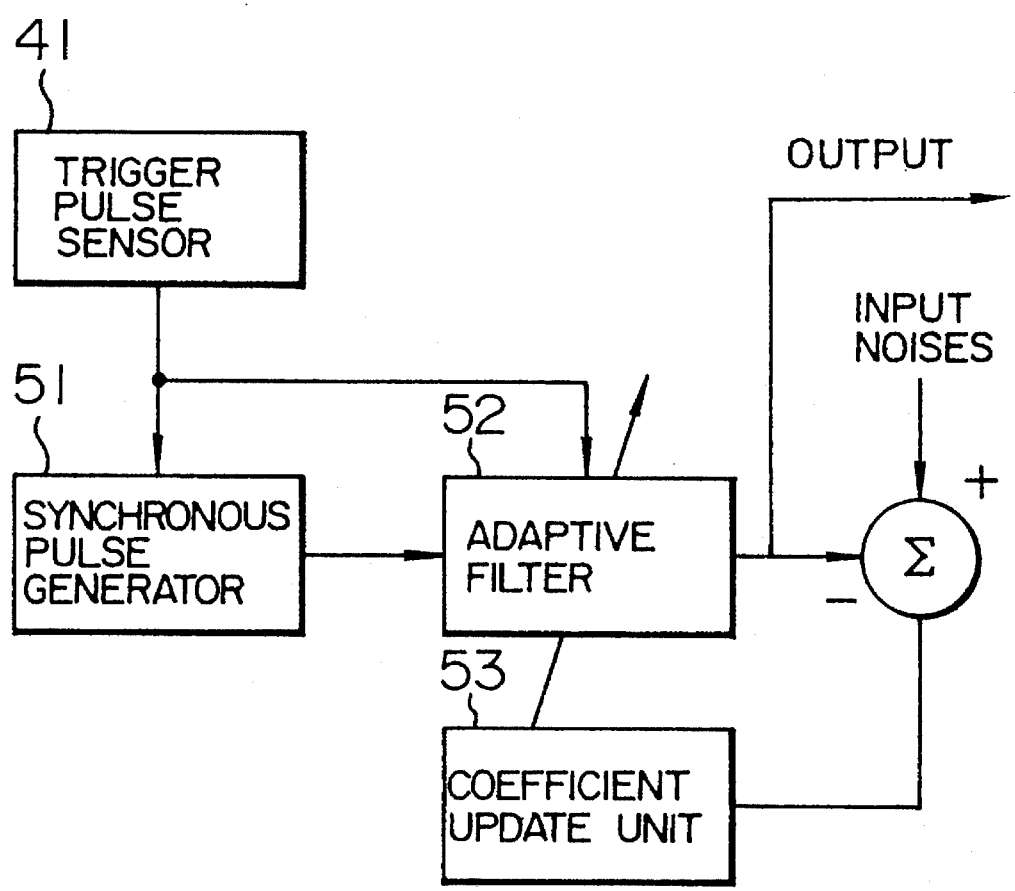
FIG. 6 is a block diagram showing a schematic arrangement of periodic signal separating means used in the third embodiment of the present invention.

FIG. 6 shows a schematic arrangement of a periodic signal separator 48 used in the third embodiment of the present invention. In FIG. 6, a numeral 51 denotes a synchronous pulse generator. A numeral 52 denotes an adaptive filter. A numeral 53 denotes a coefficient update unit. The component denoted by a numeral 41 is the same as the trigger pulse sensor 41.

Next, the operation of the third embodiment will be discussed. In FIG. 5, vibration noises from the outside, concretely, a pulse synchronized with engine vibrations is sensed by the trigger pulse sensor 41 and then is applied to the adaptive filter 42. Such a pulse is allowed to be easily realized. In the case of a rotary machine like an engine, rotation sensor for generating a pulse at each minute angle of a rotary may easily realize production of such a pulse. In the case of a car, an engine control unit for monitoring a rotary pulse signal of a cam or a crank may be used for producing a pulse.

The adaptive filter 42 operates to output a control signal to the actuator 41. The output of the actuator 41 is added to the vibration noises at a desired control point. The added result, that is, an error, is sensed as an electric signal by the sensor 45. The error is separated into a periodic error and an aperiodic error through the effect of the periodic signal separator 48. Only the periodic error is sent out to the coefficient update unit 43.

The adaptive filter 42 is a filter which uses a pulse sensed by the trigger pulse sensor 41 as a pulse and sequentially outputs a tap value of the adaptive filter 42. The adaptive filter 42 has the same number of taps as a quotient obtained by dividing the number of pulses outputted per one revolution of an engine, sensed by the trigger pulse sensor 41, by the least significant degree of the vibrations to be controlled. For example, assuming that fifty pulses per one revolution of an engine are outputted and the least significant degree of the vibrations to be controlled is a primary degree, 50/1=50 taps are provided in the adaptive filter 42. This results in keeping the output constantly synchronized with the vibrations to be controlled.

On the other hand, the coefficient update unit 43 operates to update a tap coefficient of the adaptive filter 42 on the algorithm such as a synchronous LMS by using the periodic error extracted from the periodic signal separator 48 and the transfer characteristic compensating signal obtained by the transfer characteristic converter 47 for converting the output of the transfer characteristic compensating filter 46 to a frequency of the current trigger pulse signal. According to this embodiment, an output delay of the actuator 44 and the transfer characteristics from the actuator 44 to the sensor 45 are pre-stored in the transfer characteristic compensating filter 46. The adaptive filter 42 is updated as considering these delays by using the adaptive filtered X algorithm with reference to the transfer characteristics. At the same time, the transfer characteristic compensating filter 46 needs the transfer characteristic converter 47 for converting the characteristic of the filter 46, because the filter characteristic depends on the sampling frequency and the output frequency changes on the number of revolutions of an engine.

The operation of the periodic signal separator 48 used in this embodiment will be discussed. In FIG. 6, the pulse signal primarily synchronized with the least significant vibrations of the vibrations to be controlled is generated by the synchronous pulse generator 51 and then is applied to the adaptive filter 52. The easiest method for obtaining the synchronous pulse signal is to divide a frequency of a trigger signal sensed by the trigger pulse sensor 41. Then, the coefficient update unit 53 operates to take a difference between the signal filtered by the adaptive filter 52 and the input noise signal sensed by the sensor 45 and update the coefficient of the adaptive filter 52 on the synchronous LMS algorithm so that a square of the difference may be zero (0). With this operation, the adaptive filter 52 is updated to selectively output the signal correlated with the pulse signal, that is, a primary or higher degree among the input noises and separate and extract only the vibration components correlated with the pulse from the input noises.

At the same time, the adaptive filter 52 has the same tap length as the adaptive filter 42 shown in FIG. 5. Further, the adaptive filter 52 has N taps and operates to sequentially output a tap value of its own at each N-divided period of the periodic signal part of the input noises, i.e., with a pulse sensed by the trigger pulse sensor 41 serving as a trigger signal. That is, the filter 52 works in similar fashion to the adaptive filter 42 shown in FIG. 5. Hence, the adaptive control device enables sensing of a trigger signal synchronized with a change of a number of revolutions of an engine, thereby constantly keeping the pulse synchronized with the number of revolutions of an engine.

It goes without saying that the third embodiment may use a differently arranged periodic signal separator, for example, a separator indicated as shown in FIG. 3 or 4.

FIG. 7 shows a schematic arrangement of an adaptive control device according to a fourth embodiment of the present invention. In FIG. 7, a numeral 61 denotes a trigger pulse sensor. A numeral 62 denotes an adaptive filter. A numeral 63 denotes a coefficient update unit. A numeral 64 denotes an actuator serving as an electrical-mechanical converting means. A numeral 65 denotes a sensor serving as an error signal sensing means. A numeral 66 denotes a transfer characteristic compensating filter for identifying the transfer characteristics from the adaptive filter 62 to the sensor 65 in advance. A numeral 67 denotes a transfer characteristic converter for converting the transfer characteristics into a frequency of the sensed trigger pulse signal. A numeral 68 denotes a periodic signal separator. A numeral 69 denotes a phase compensating filter. Except for the phase compensating filter 69, the fourth embodiment has the same arrangement as the third embodiment.

Next, the operation of the fourth embodiment of the invention will be discussed. The different respect of the arrangement shown in FIG. 5 from the third embodiment is that after the error is separated into the periodic error and the aperiodic error through the effect of the periodic signal separator 68, the aperiodic error passes through the phase compensating filter 69 and the filtered aperiodic error is added to the output of the adaptive filter 62. The phase compensating filter 69 serves to compensate for a phase delay caused by the actuator 64 and suppress vibrations of the control system.

As described above, the fourth embodiment provides another control system arranged for cancelling aperiodic noises. Hence, it may cancel both periodic and aperiodic noises.

The present invention is not limited to the foregoing embodiments. For example, the periodic signal separator may be inserted after the reference signal sensor.

The present invention is capable of separating an output error, that is, a differential output between the input noises containing the periodic noises and the output of the filter, through the effect of the periodic signal separator. With the separated error signal, the adaptive filter is worked. Hence, the present invention enables prevention of a malfunction caused by the aperiodic error contained in the output error and cancellation of the periodic error much faster. Further, the invention enables the system to sufficiently correspond to the periodic change of noises.

What is claimed is:

1. An adaptive control device comprising:

means for separating input noises into a periodic signal and other signals;

an adaptive filter, receiving a reference signal an input, for canceling the periodic signal contained in said input noises and for generating a control signal at an output in accordance with said reference signal;

means receiving said input noises and said control signal, for deriving a differential input signal between said input noises and said control signal and for outputting an output error corresponding to said differential input signal; and means for correcting a coefficient of said adaptive filter in accordance with periodic error components picked up by said means for separating from said output error, said means for correcting being connected to receive said reference signal and being connected to said means for separating to receive a signal representing said periodic error components and to said adaptive filter to correct said coefficient.

2. An adaptive control device comprising:

means for separating input noises into a periodic signal and other signals;

an adaptive filter receiving a reference signal at an input, for canceling the periodic signal of the input noises and for generating a control signal at an output in accordance with said reference signal;

means, receiving said input noises and said control signal, for deriving a differential input signal between said input noises and said control signal and for outputting an output error corresponding to said differential input signal;

coefficient updating means for correcting a coefficient of said adaptive filter from periodic error components derived by said means for separating from said output error, said coefficient updating means being connected to receive said reference signal and being connected to said means for separating to receive a signal representing said output error and to said adaptive filter to correct said coefficient; and a phase compensating filter coupled to said means for separating and to said output of said adaptive filter, for phase compensating for aperiodic components of said output error for canceling the aperiodic components of said input noises.

3. An adaptive control device as claimed in claim 1, wherein said means for separating includes a delaying element, a second adaptive filter for forming a filter coefficient which makes a difference between an output of said delay element derived from an input signal and an output of said second adaptive filter equal to zero, and coefficient updating means for correcting said filter coefficient of said second adaptive filter by using a difference between the output of said delaying element and the output of said second adaptive filter.

4. An adaptive control device as claimed in claims 2, wherein said means for separating includes a delaying element, a second adaptive filter for forming a filter coefficient which makes a difference between an output of said delaying element derived from an input signal and an output of said second adaptive filter equal to zero, and coefficient updating means for correcting said filter coefficient of said second adaptive filter with a difference between the output of said delaying element and the output of said second adaptive filter.

5. The adaptive control device as claimed in claim 1, wherein said means for separating includes a synchronous adaptive filter having of N taps for sequentially outputting filter coefficients at each N-divided period of the periodic signal of the input noises, and coefficient updating means for updating a tap number of said synchronous adaptive filter with a difference between an output of said synchronous adaptive filter and an output error corresponding to a differential signal between the input noises and the output of said adaptive filter.

6. The adaptive control device as claimed in claim 2, wherein said means for separating includes a synchronous adaptive filter having N taps for sequentially outputting filter coefficients at each N-divided period of the periodic signal of the input noises, and coefficient updating means for updating a tap number of said synchronous adaptive filter with a difference between the output of said synchronous adaptive filter and an output error corresponding to a differential signal between the input noises and the output of said adaptive filter.

7. An adaptive control device as claimed in claim 1, further comprising a reference signal sensor for sensing a vibration of a vibration source, producing said reference signal in accordance with said vibration and outputting said reference signal to said adaptive filter, said adaptive filter canceling said periodic signal contained in said input noises in accordance with said reference signal.

8. An adaptive control device as claimed in claim 2, further comprising a trigger pulse sensor for producing trigger pulses synchronized with vibrations from a vibration source and outputting said trigger pulses as said reference signal to said adaptive filter, said adaptive filter canceling said periodic signal of said input noises in accordance with said trigger pulses.

* * * * *